United States Patent [19]
Horie et al.

[11] Patent Number: 6,132,512
[45] Date of Patent: Oct. 17, 2000

[54] VAPOR-PHASE FILM GROWTH APPARATUS AND GAS EJECTION HEAD

[75] Inventors: Kuniaki Horie, Yamato; Tsutomu Nakada, Yokohama; Takeshi Murakami, Tokyo; Hidenao Suzuki, Fujisawa; Masahito Abe, Fujisawa; Yuji Araki, Fujisawa, all of Japan

[73] Assignee: Ebara Corporation, Tokyo, Japan

[21] Appl. No.: 09/003,948

[22] Filed: Jan. 8, 1998

[30] Foreign Application Priority Data

| Jan. 8, 1997 | [JP] | Japan | 9-029874 |
| Feb. 17, 1997 | [JP] | Japan | 9-049676 |
| Feb. 17, 1997 | [JP] | Japan | 9-049678 |

[51] Int. Cl.[7] .................................................. C23C 16/00
[52] U.S. Cl. ..................... 118/715; 239/423; 239/432; 239/433; 239/434
[58] Field of Search .................. 118/715; 239/423, 239/432, 433, 434

[56] References Cited

U.S. PATENT DOCUMENTS

| 1,437,201 | 11/1922 | Schumann . |
| 3,916,822 | 11/1975 | Robinson . |
| 4,304,549 | 12/1981 | Pfau . |
| 4,407,456 | 10/1983 | Daniel et al. . |
| 5,532,190 | 7/1996 | Goodyear et al. . |
| 5,728,223 | 3/1998 | Murakami et al. . |
| 5,829,683 | 11/1998 | Beaudoin et al. . |
| 5,950,646 | 9/1999 | Horie et al. . |
| 5,950,925 | 9/1999 | Fukunaga et al. . |

FOREIGN PATENT DOCUMENTS

| 0 717 126 A2 | 6/1996 | European Pat. Off. . |
| 0 738 788 A2 | 10/1996 | European Pat. Off. . |
| 747503 | 11/1996 | European Pat. Off. . |
| 0 747 503 A1 | 12/1996 | European Pat. Off. . |
| 196 05 254 A1 | 8/1996 | Germany . |
| 7-32128 | 4/1995 | Japan . |

OTHER PUBLICATIONS

"Supersonic Reactive Gas Jet Chemical Processing", IBM Technical Disclosure Bulletin, vol. 35, No. 2, Jul. 1, 1992, p. 402/403 XP000313336.

Morio Tsuge et al., "Mechanical Thermodynamics", pp. 162–169, Asakura Shoten, Nov. 1967, Japan.

New U.S. Patent Application filed Jan. 8, 1998, entitled "Vapor Feed Supply System", by Kuniaki Horie et al., Atty. Docket No. 1213/GEB614US.

*Primary Examiner*—Stanley S. Silverman
*Assistant Examiner*—Michael P. Colaianni
*Attorney, Agent, or Firm*—Wenderoth, Lind & Ponack, L.L.P.

[57] ABSTRACT

A vapor-phase film growth apparatus includes a substrate holder for holding a substrate, a gas ejection head, and a radiant heat shield device. The substrate holder has a substrate heater therein, and the gas ejection head has a gas injection surface for ejecting a material gas toward a substrate held by the substrate holder. The radiant heat shield device is disposed between the substrate holder and the gas injection head in confronting relationship to the gas injection surface of the gas ejection nozzle. The substantially planar radiant heat shield device is permeable to gases and has a heating capability.

9 Claims, 15 Drawing Sheets

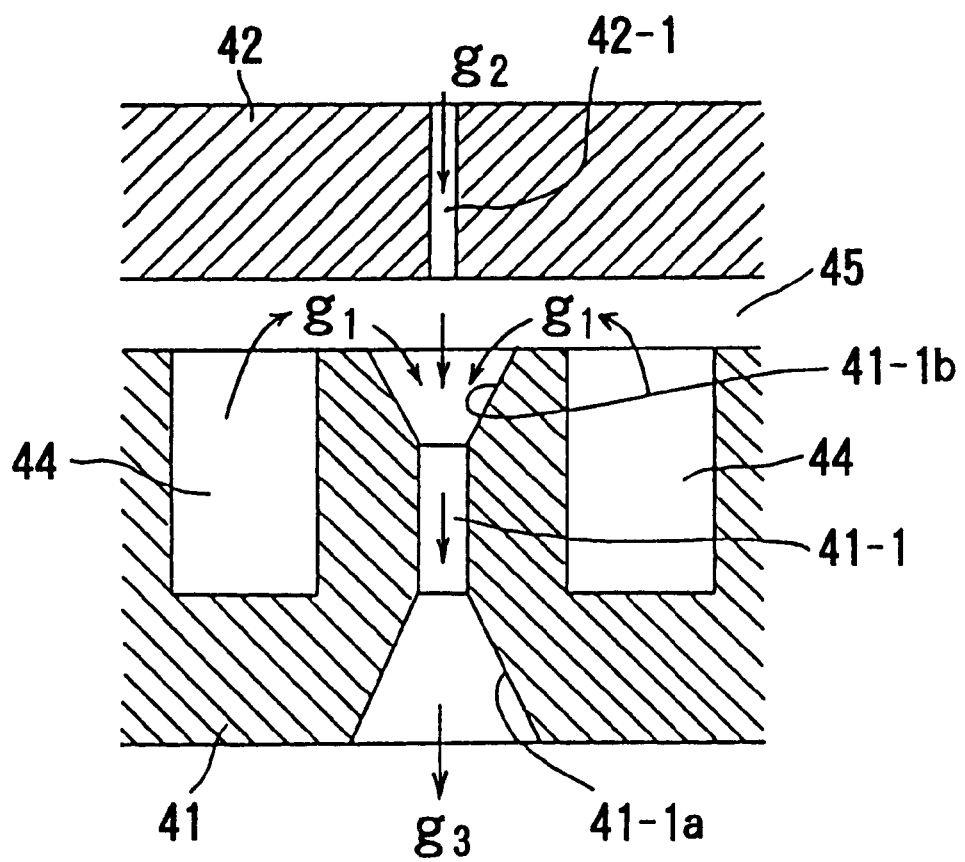
F I G. 14

F I G. 16
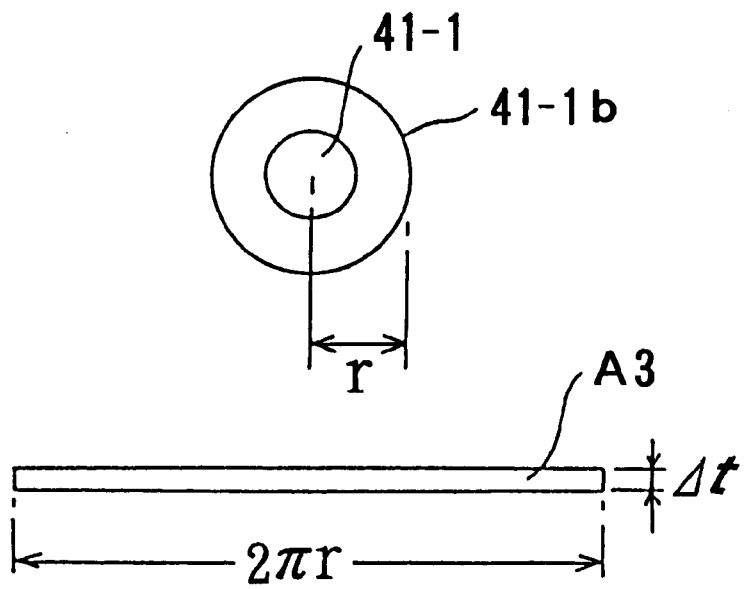
F I G. 17
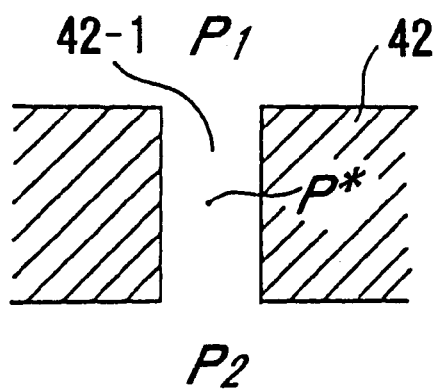

VAPOR-PHASE FILM GROWTH APPARATUS AND GAS EJECTION HEAD

BACKGROUND OF THE INVENTION

1. Field of the Invention

The present invention relates to a vapor-phase film growth apparatus, and more particularly to a vapor-phase thin-film growth apparatus for depositing, for example, a highly dielectric or ferroelectric thin film of barium titanate/strontium or the like on a substrate by way of vapor-phase growth. The present invention is also concerned with a gas ejection head for use in a vapor-phase thin-film growth apparatus, and more particularly with a gas ejection head capable of uniformly ejecting a material gas and an oxide gas.

2. Description of the Prior Art

The degree of integration of integrated circuits fabricated by the semiconductor industries has been increasing so rapidly in recent years that research and development activities are switching from present megabit-order DRAMs to gigabit-order DRAMs in the future. For manufacturing such DRAMs, it is necessary to use a capacitor element capable of achieving a large capacitance with a small area. Promising dielectric thin-film materials for use in the manufacture of such a capacitor element are metal-oxide thin-film materials including tantalum pentoxide ($Ta_2O_5$) having a dielectric constant of about 20, barium titanate ($BaTiO_3$) having a dielectric constant of about 300, strontium titanate ($SrTiO_3$), and a mixture thereof, i.e., barium strontium titanate, rather than silicon oxide or silicon nitride having a dielectric constant of 10 or less.

For depositing a thin film of such a metal oxide on a substrate by way of vapor-phase growth, a material gas comprising one or more organic metal compounds and an oxide gas are mixed with each other, and the mixture gas is ejected toward the substrate which has been heated to a certain temperature.

More specifically, the substrate is delivered into a film deposition chamber (reaction chamber) and placed on a substrate holder. While the substrate on the substrate holder is being heated to the desired temperature by a heater that is either housed in the substrate holder or positioned below the substrate holder, the mixture gas is ejected toward the substrate from a gas ejection head disposed in the film deposition chamber.

When the thin film is grown on the substrate using the material gas, a metal compound such as $SrO_2$, $SrCO_3$, $BaO_2$, or $BaCO_3$, or an intermediate compound formed from the organic metal compound or compounds is generated and deposited on a mixture gas ejection surface of the gas ejection head. The deposited compound is then peeled of f from the mixture gas ejection surface due to the difference between the coefficients of thermal expansion of the deposited compound and the gas ejection head in heat cycles produced at the time the vapor-phase thin-film growth apparatus is operated and shut off. The peeled-off deposited compound tends to produce particles and contaminate the substrate.

To solve the above problem, it has been proposed to provide a cooling mechanism in the gas ejection head for circulating a coolant in the gas ejection head to cool the gas ejection head for thereby preventing metal compounds from being deposited on the gas ejection head.

However, the cooling mechanism is unable to completely prevent metal compounds from being deposited on the gas ejection head because the surface of the gas ejection head which faces the substrate is directly exposed to radiant heat from the substrate heated by the heater. Thus, there is a considerable difference between the temperature at which the mixture gas is kept and the temperature at which the thin film is deposited on the substrate.

Once a compound is deposited on the gas ejection head, it is necessary to remove the deposited compound from the gas ejection head. Hence, the gas ejection head needs to be taken out of the film deposition chamber. However, the process of cleaning the gas ejection head is quite difficult to carry out since gas supply lines for supplying the material gas and the oxide gas are connected to the gas ejection head, a coolant line is connected to the cooling mechanism, and the gas ejection head is heavy itself.

Because the organic metal compound gas is liquid at normal temperature, the gas ejection head needs to be heated in order to keep the gas from being condensed. According to one proposal, a heating liquid medium is introduced into the gas ejection head to heat the gas ejection head. FIG. 1 of the accompanying drawings shows a conventional gas ejection head which has a heating structure for heating the gas ejection head with a heating liquid medium, as disclosed in Japanese patent application No. 7-119260.

As shown in FIG. 1, the conventional gas ejection head comprises a lower plate 101 and an upper plate 102 which are spaced from each other, defining a hollow space therebetween. The upper plate 102 has a plurality of ribs 103 extending downwardly through the hollow space toward the lower plate 101 and dividing the hollow space into a circulatory passage 104 for a heating liquid medium. A plurality of nozzle tubes 105 are fixed, as by welding, to the upper plate 102 and the lower plate 101 and extend through the hollow space. While the heating liquid medium is flowing through the circulatory passage 104 to heat the gas ejection head, the material gas is ejected from the nozzle tubes 105 into the film deposition chamber.

Since the circulatory passage 104 lies fully over the mixture gas ejection surface of the gas ejection head, it provides a uniform heating capability to the entire mixture gas ejection surface. However, the process of manufacturing the gas ejection head is tedious and time-consuming because it is necessary to weld or otherwise fix each of the nozzle tubes 105 to the upper and lower plates 102, 101 for fully sealing the circulatory passage 104 from the nozzle tubes 105. Furthermore, many nozzle tubes 105 need to be fixed to the upper and lower plates 102, 101 in order to eject the material gas as uniformly as possible from the mixture gas ejection surface of the gas ejection head. Accordingly, the process of fixing the nozzle tubes 105 becomes more complex and time-consuming as the mixture gas is to be ejected more uniformly from the gas ejection head.

The material gas and the oxide gas need to be mixed at a proper position or time. If the material gas and the oxide gas are not mixed at a proper position or time, then various problems are caused.

If the material gas and the oxide gas are mixed too early, e.g., if the material gas and the oxide gas are mixed too far upstream of the gas ejection head, then the material gas will react before reaching the gas ejection head, and a substance produced by the reaction will be deposited on wall surfaces of the gas ejection head, possibly producing particles. The reaction of the material gas prior to the gas ejection head results in a reduction in the ability of the mixture gas to form a film on the substrate.

If the material gas and the oxide gas are mixed too late, e.g., if the material gas and the oxide gas are mixed downstream of the gas ejection head, then the position where they are mixed is too close to the substrate in the film deposition chamber for the material gas and the oxide gas to be well mixed together. The incomplete mixing results in a reduction in the ability of the mixture gas to form a film on the substrate.

The gas ejection heads used in a conventional vapor-phase film growth apparatus incorporate various structural details for uniformly distributing a gas or uniformly mixing a plurality of gases. For uniform distribution of a gas, for example, a resistance to gas flows is added to individual divided gas passages, or a gas passage is progressively branched into a plurality of smaller gas passages. For uniformly mixing a plurality of gases, for example, the gas ejection heads include design considerations given to the position where the gases are mixed together.

Because of those structural details, the gas ejection heads are highly complex in structure, and hence suffer the following shortcomings:

(1) The structure for heating the gas ejection heads is complex.

(2) The material gas tends to be condensed and decomposed in the gas ejection heads, producing deposits in the gas ejection heads.

(3) It is not easy to clean the gas ejection heads to remove deposits.

(4) The maintenance of the gas ejection heads is difficult to carry out.

(5) The gas ejection heads which are structurally complex are difficult to manufacture.

SUMMARY OF THE INVENTION

It is therefore an object of the present invention to provide a vapor-phase film growth apparatus which will minimize the deposition of reaction-produced substances on a gas ejection head and will allow the inside of a film deposition chamber to be cleaned with ease.

Another object of the present invention is to provide a gas ejection head which can uniformly eject a material gas from a gas ejection surface thereof, can be manufactured in a relatively simple process, and has a material gas passage and a heating medium passage that are completely sealed relative to each other.

Still another object of the present invention is to provide a gas ejection head which will mix a material gas and an oxide gas with each other at a proper time and with efficiency.

Yet still another object of the present invention is to provide a gas ejection head which will solve the above problems based on the choked phenomenon, is simple in structure, and is capable of uniformly distributing and mixing gases.

According to an aspect of the present invention, there is provided a vapor-phase film growth apparatus comprising a substrate holder for holding a substrate, the substrate holder having a substrate heater therein, a gas ejection head having a gas injection surface for ejecting a material gas toward a substrate held by the substrate holder, and a substantially planar radiant heat shield device disposed between the substrate holder and the gas injection head in a confronting relationship to the gas injection surface of the gas ejection nozzle, the radiant heat shield device being permeable to gases and having a heating capability.

The radiant heat shield device shields radiant heat applied from the substrate holder by the substrate heater to minimize the deposition of compounds on the gas ejection head. Since the radiant heat shield device is permeable to gases and has a heating capability, the material gas from the gas ejection head is allowed to pass through the radiant heat shield device toward the substrate, and is prevented from falling in temperature. While a large amount of compounds tend to be deposited on the radiant heat shield device as it is directly exposed to the radiant heat from the substrate holder, the deposited compounds can easily be removed from the radiant heat shield device because it is separate from the gas ejection head.

The vapor-phase film growth apparatus further includes a film deposition chamber which houses the substrate holder, the gas ejection head, and the radiant heat shield device, and the radiant heat shield device is removable from and insertable into the film deposition chamber laterally or vertically. Consequently, the radiant heat shield device can easily be removed from the film deposition chamber and cleaned to remove deposits therefrom and otherwise serviced for maintenance.

According to another aspect of the present invention, there is provided a gas ejection head for use in a vapor-phase film growth apparatus, comprising a planar nozzle head body having a plurality of nozzle orifices for uniformly ejecting a film deposition gas therethrough. A pair of arrays of heating liquid medium passages are defined in the planar nozzle head body for passage of a heating liquid medium therethrough.

Because the heating liquid medium passages are disposed in the two arrays in the planar nozzle head body, the gas ejection head has an excellent heating capability, and can be manufactured according to a relatively simple process.

The heating liquid mediums flowing respectively through the arrays of the heating liquid medium passages may be individually controlled in temperature. Therefore, it is possible to use one of the arrays (e.g., upper array) of the heating liquid medium passages to keep an upstream portion of the nozzle head body heated, and use the other array (e.g., lower array) of the heating liquid medium passages to prevent the nozzle head body from being heated by radiant heat applied from the substrate heater that is disposed below the nozzle head body in a vapor-phase film growth apparatus.

The gas ejection head further includes a common heating liquid medium passage disposed around the nozzle head body for supplying the heating liquid medium to and receiving the heating liquid medium from the heating liquid medium passages in the arrays. The heating liquid medium passages in the arrays and the common heating liquid medium passage may be combined to provide various passage patterns for the heating liquid medium in the nozzle head body.

According to still another aspect of the present invention, there is provided a gas ejection head for use in a vapor-phase film growth apparatus, comprising a planar nozzle head body having a plurality of nozzle orifices for uniformly ejecting a material gas and an oxide gas therethrough. The material gas and the oxide gas are mixed in the nozzle orifices.

Since the material gas and the oxide gas are mixed in the nozzle orifices, they are mixed at an appropriate time. The material gas and the oxide gas are prevented from reacting upstream of the gas ejection head, producing substances from the reaction, depositing the produced substances on wall surfaces of the gas ejection head, and producing particles. The material gas and oxide gas prevented from being mixed incompletely.

According to yet still another aspect of the present invention, there is provided a gas ejection head for uniformly ejecting a gas through a plurality of orifices. Each of the orifices has a minimum cross-sectional area $F_c$ (m$^2$) selected to satisfy the following expression:

$$F_c \leq m_c/[\{2/(k+1)\}^{1/(k-1)}\{k/(k+1)\}^{1/2}\{2(p_1/v_1)\}^{1/2}]$$

where $m_c$: the mass flow (kg/s) per orifice;
- k: ratio of specific heats (constant dependent on the gas);
- $p_1$: the pressure (pa) of the gas at the gas inlet side of the orifice; and
- $v_1$: the specific volume (m$^3$/kg) of the gas at the gas inlet side of the orifice.

Since the minimum cross-sectional area $F_c$ (m$^2$) of the orifices is selected to satisfy the above expression, the gas flow through the orifices is choked thereby to allow the gas to be mixed and distributed uniformly through a relatively simple structure.

Furthermore, the orifices are divided into front nozzle orifices and rear nozzle orifices with intermediate gas inlet regions disposed therebetween, and the minimum cross-sectional area $F_c$ (m$^2$) of each of the front nozzle orifices and the intermediate gas inlet regions is selected to satisfy the expression for choking the gas flowing through the front nozzle orifices and the intermediate gas inlet regions.

Inasmuch as the gas flowing through the front nozzle orifices and the intermediate gas inlet regions is choked, the gas is uniformly ejected from the front nozzle orifices and the intermediate gas inlet regions, and then efficiently mixed in the rear nozzle orifices, from which the mixed gas is uniformly ejected.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 14 is an enlarged fragmentary cross-sectional view of nozzle orifices of the gas ejection head shown in FIGS. 13A and 13B;

FIG. 16 is a schematic view of a rear nozzle orifice and a minimum cross-sectional area of an inlet section thereof, of the gas ejection head shown in FIGS. 13A and 13B;

FIG. 17 is an enlarged fragmentary cross-sectional view illustrative of a choked phenomenon caused by a front nozzle orifice of the gas ejection head shown in FIGS. 13A and 13B;

DETAILED DESCRIPTION OF THE PREFERRED EMBODIMENTS

Figure 1:
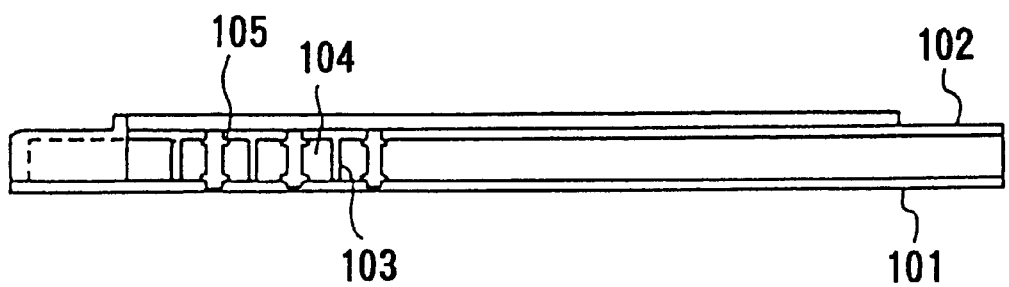
FIG. 1 is a cross-sectional view of a conventional gas ejection head.

Like or corresponding parts are denoted by like or corresponding reference numerals throughout views.

Figure 2:
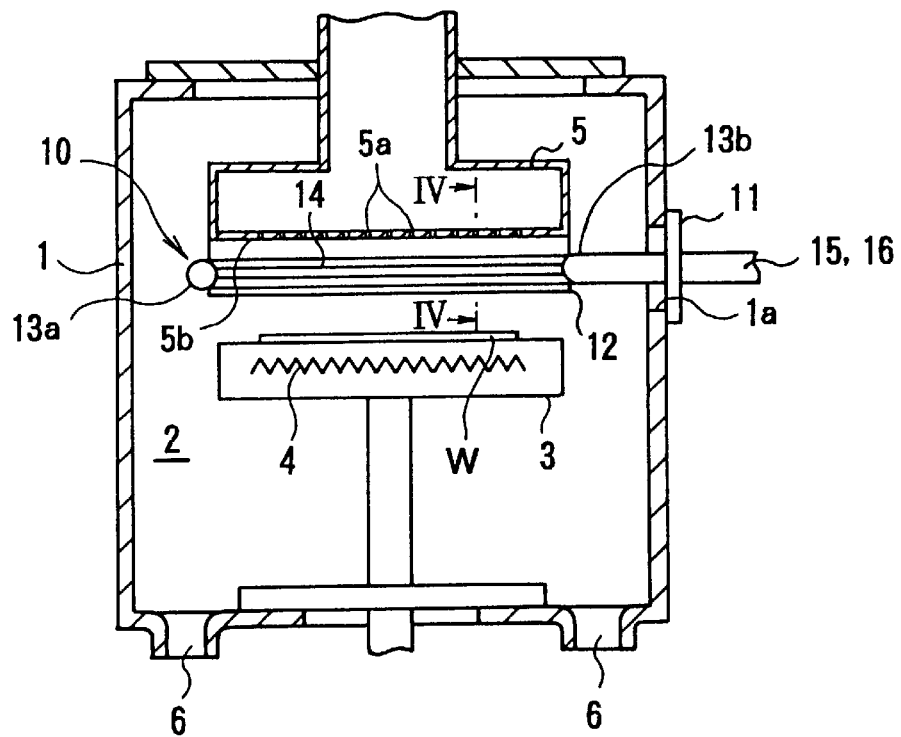
FIG. 2 is a vertical cross-sectional view of a vapor-phase film growth apparatus according to an embodiment of the present invention.
Figure 3:
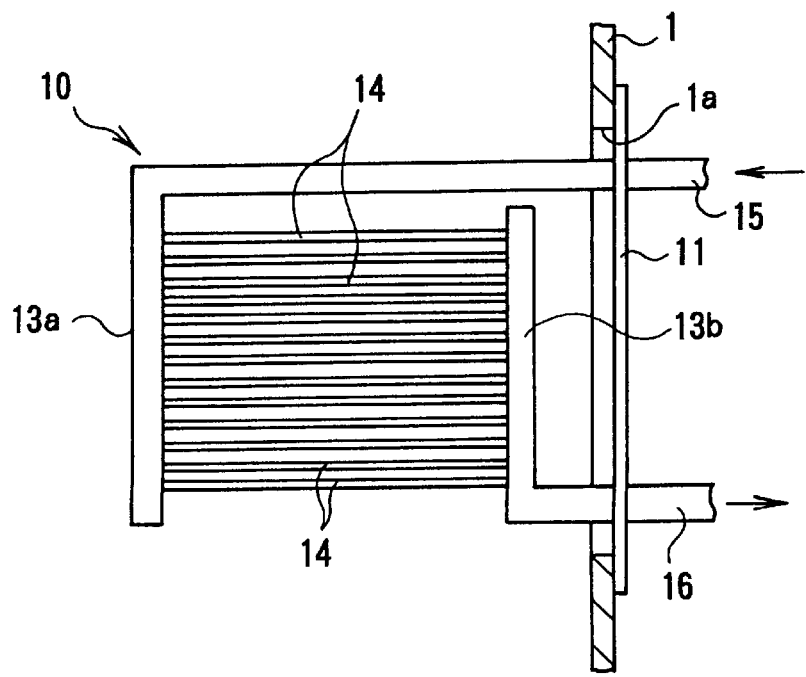
FIG. 3 is a plan view of a radiant heat shield device in the vapor-phase film growth apparatus shown in FIG. 2.
Figure 4:
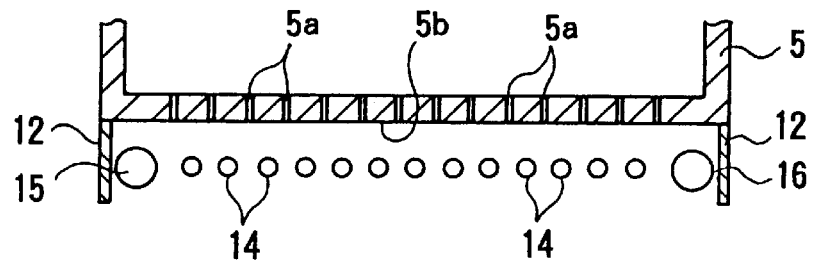
FIG. 4 is a cross-sectional view taken along line IV—IV of FIG. 2.

FIGS. 2, 3, and 4 show a vapor-phase film growth apparatus according to an embodiment of the present invention.

The vapor-phase film growth apparatus shown in FIGS. 2 through 4 is suitable for use in depositing a metal-oxide thin film of barium strontium titanate on a substrate by way of vapor-phase growth by ejecting, toward the substrate that has been heated to a certain temperature, a mixture of an oxide gas and a material gas, which has been produced by dissolving Ba, Sr, Ti or their compound, as a DPM compound, into respective organic solvents, producing a plurality of liquid materials, mixing the liquid materials with each other, and evaporating the mixture with an evaporator.

As shown in FIG. 2, the vapor-phase film growth apparatus has a substantially cylindrical outer wall 1 defining a film deposition chamber (reaction chamber) 2 therein, a substrate holder 3 vertically movably disposed in the film deposition chamber 2, and a substrate heater 4 housed in the substrate holder 3 for heating a substrate W placed on an upper surface of the substrate holder 3 to a film deposition temperature.

The vapor-phase film growth apparatus also includes a gas ejection head 5 positioned above the substrate holder 3 for ejecting a material gas toward the substrate W. The gas ejection head 5 has a plurality of gas ejection ports 5a defined in a lower panel thereof for ejecting a mixture of a material gas, which comprises Ba, Sr, Ti, etc. and an oxide gas, toward the substrate W on the substrate holder 3.

While the substrate W on the substrate holder 3 is being heated up to the film deposition temperature, the mixture gas is ejected from the gas ejection head 5 toward the substrate 3 for thereby depositing a metal-oxide thin film of barium strontium titanate on an upper surface of the substrate W by way of vapor-phase growth.

The film deposition chamber 2 has a plurality of discharge ports 6 defined in a lower wall thereof for discharging the gas after the reaction to form the thin film on the substrate W.

Between the substrate holder 3 and the gas ejection head 5, there is disposed a substantially planar radiant heat shield device 10 substantially parallel to a gas ejection surface 5b of the lower panel of the gas ejection head 5. The cylindrical outer wall 1 has an opening 1a defined laterally therein which is closed by a closure plate 11 on which the radiant heat shield device 10 is supported. The radiant heat shield device 10 has a vertical cross-sectional shape smaller than the size of the opening 1a, so that the radiant heat shield device 10 can horizontally be removed from the film deposition chamber 1 through the opening 1a which is closed by the closure plate 11.

Downwardly extending guide plates 12 for preventing the gas from the gas ejection head 5 from leaking laterally are attached to respective opposite side edges of the lower panel of the gas ejection head 10 parallel to the direction in which the radiant heat shield device 10 is removable from the film deposition chamber 1.

The radiant heat shield device 10 is permeable to gases for allowing the mixture gas from the gas ejection head 5 to be smoothly transferred to the substrate W, and has a heating capability for preventing the mixture gas from the gas ejection head 5 from being lowered in temperature.

Specifically, as shown in FIG. 3, the radiant heat shield device 10 comprises a pair of main pipes 13a, 13b parallel to each other, a plurality of thin parallel pipes 14 extending between and connected to the main pipes 13a, 13b, the thin parallel pipes 14 being spaced at a given pitch, a heat medium supply pipe 15 connected to the main pipe 13a and supported on the closure plate 11, and a heat medium discharge pipe 16 connected to the main pipe 13b and supported on the closure plate 11.

A heating liquid medium such as oil heated at a temperature of 250° C., for example, is introduced from the heat medium supply pipe 15 into main pipe 13a, and separated to flow through the thin pipes 14 into the main pipe 13b. Then, the heating liquid medium flows from the main pipe 13b into the heat medium discharge pipe 16, from which the heating liquid medium is discharged. Therefore, the mixture gas ejected from the gas ejection head 5 is heated by the heating liquid medium flowing through the thin pipes 14. The mixture gas ejected from the gas ejection head 5 also flows smoothly through gaps between the thin pipes 14 toward the substrate W.

Even though the thin pipes 14 are disposed between the gas ejection head 5 and the substrate W, the mixture gas ejected from the gas ejection head 5 is uniformly scattered below the thin pipes 14 before reaching the substrate W. Therefore, the mixture gas does not leave a striped mark on the substrate W.

While the heating liquid medium is flowing through the thin pipes 14, the substrate W placed on the substrate holder 3 is heated to the desired temperature by the substrate heater 4, and the mixture gas is ejected from the gas ejection head 5 toward the substrate W for thereby depositing a thin film of metal oxide on the upper surface of the substrate W by way of vapor-phase growth. At this time, the radiant heat shield device 10 shields radiant heat from the substrate W for thereby minimizing the deposition of metal compounds such as $SrCO_3$, etc. on the gas ejection head 5.

Because the radiant heat shield device 10 is permeable to gases and has a heating capability, as described above, the mixture gas ejected from the gas ejection head 5 is allowed to be smoothly transferred to the substrate W, and the mixture gas from the gas ejection head 5 is prevented from being lowered in temperature.

A large amount of metal compounds is deposited on the radiant heat shield device 10 as it is directly exposed to the radiant heat from the substrate W. The deposited metal compounds can easily be removed from the radiant heat shield device 10 after the radiant heat shield device 10 is removed from the film deposition chamber 2.

Figure 5:
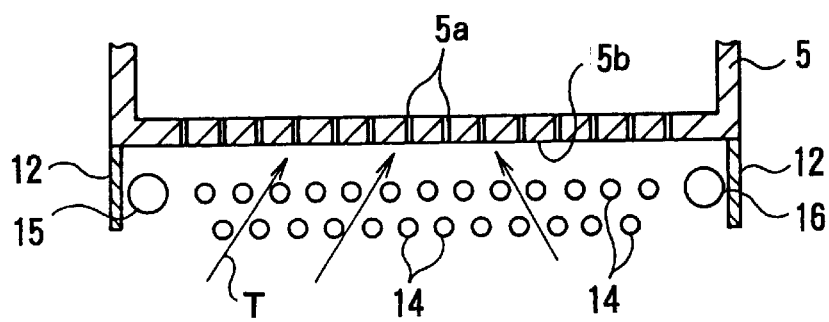
FIG. 5 is a view similar to FIG. 4, showing a vapor-phase film growth apparatus according to another embodiment of the present invention.

FIG. 5 shows a vapor-phase film growth apparatus according to another embodiment of the present invention. In FIG. 5, a radiant heat shield device has upper and lower arrays of thin pipes 14 which are horizontally staggered with respect to each other for preventing metal compounds from being deposited on the gas ejection head 5 more effectively. Depending on the diameter of the thin pipes 4 (the smaller the diameter of the thin pipes 4, the greater the permeability to gases of the radiant heat shield device), radiant heat coming obliquely from the substrate T in the directions indicated by the arrows W may be transmitted through gaps between the thin pipes 14 to the gas ejection head 5.

Figure 6:
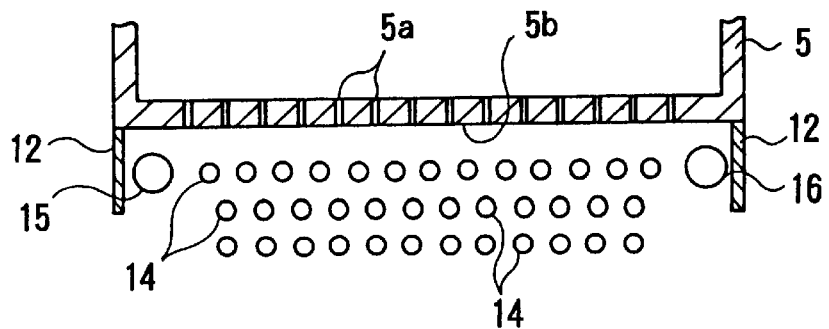
FIG. 6 is a view similar to FIG. 4, showing a vapor-phase film growth apparatus according to still another embodiment of the present invention.

FIG. 6 shows a vapor-phase film growth apparatus according to still another embodiment of the present invention. In FIG. 6, a radiant heat shield device has upper, middle, and lower arrays of thin pipes 14. The upper and middle arrays of thin pipes 14 are horizontally staggered with respect to each other. The thin pipes 14 in the lower array are disposed in such positions that they will prevent the radiant heat from being transmitted obliquely to the gas ejection head 5. The thin pipes 14 thus arranged in the upper, middle, and lower arrays are effective in fully preventing the radiant heat from reaching the gas ejection head 5.

Figure 7:
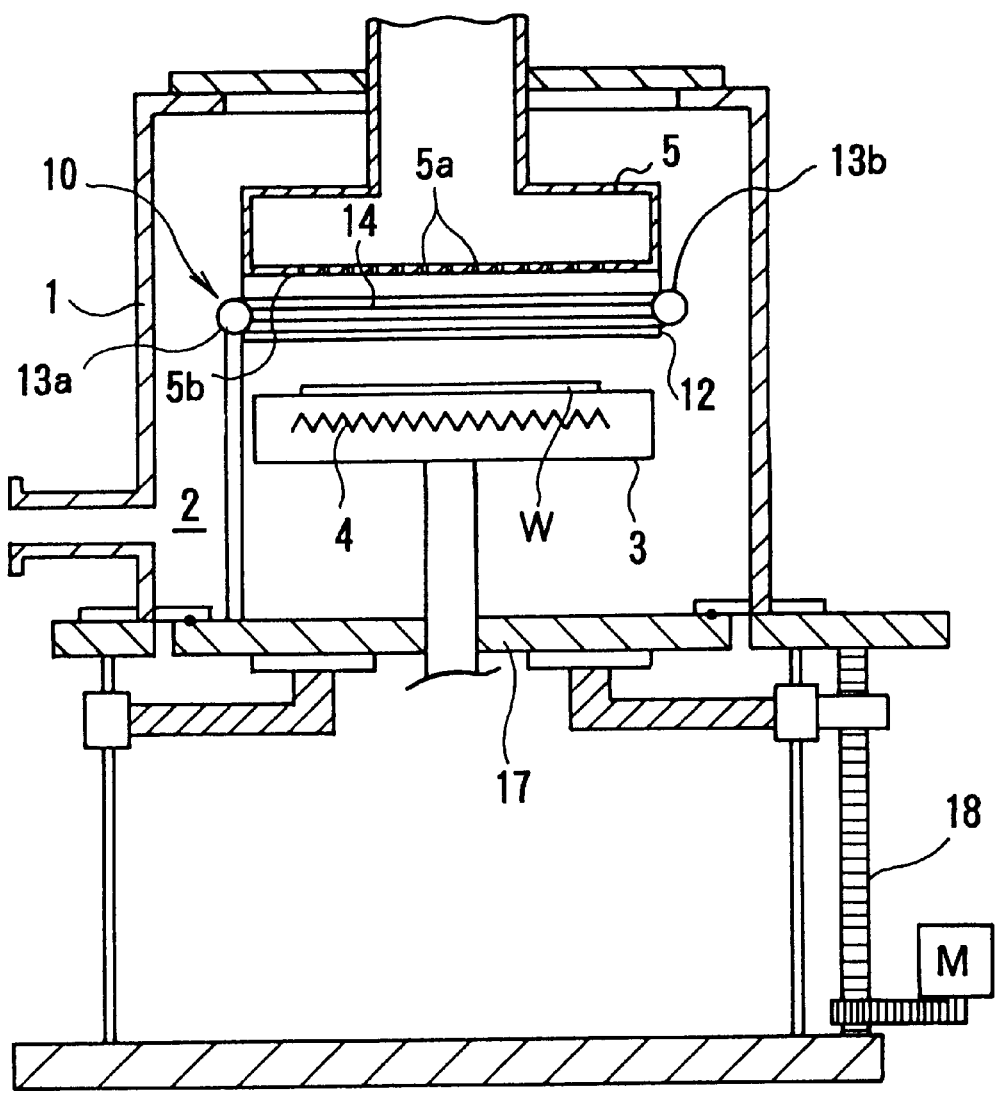
FIG. 7 is a vertical cross-sectional view of a vapor-phase film growth apparatus according to a further embodiment of the present invention.

FIG. 7 shows a vapor-phase film growth apparatus according to a further embodiment of the present invention. The vapor-phase film growth apparatus shown in FIG. 7 differs from the vapor-phase film growth apparatus shown in FIG. 2 in that the radiant heat shield device 10 is supported on a table 17 which is vertically movable by a motor M through a gear and screw mechanism 18. The radiant heat shield device 10 can thus be removed vertically from the film deposition chamber 2 when the table 17 is lowered by the motor M.

Figure 8A:
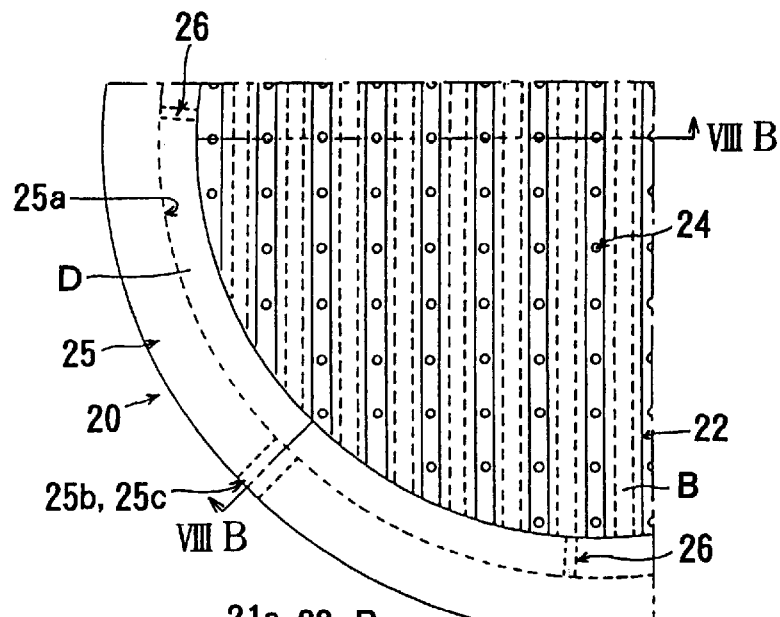
FIG. 8A is a fragmentary plan view of a gas ejection head according to an embodiment of the present invention.
Figure 8B:
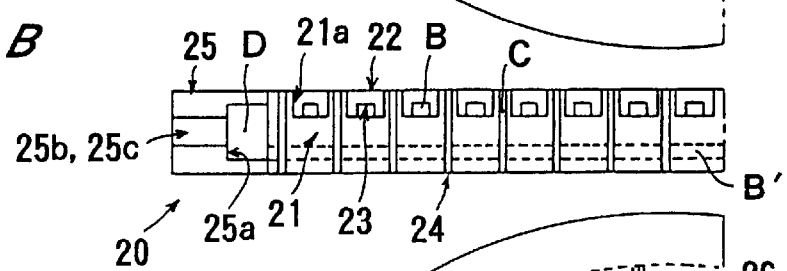
FIG. 8B is a cross-sectional view taken along line VIIIB—VIIIB of FIG. 8A.
Figure 8C:
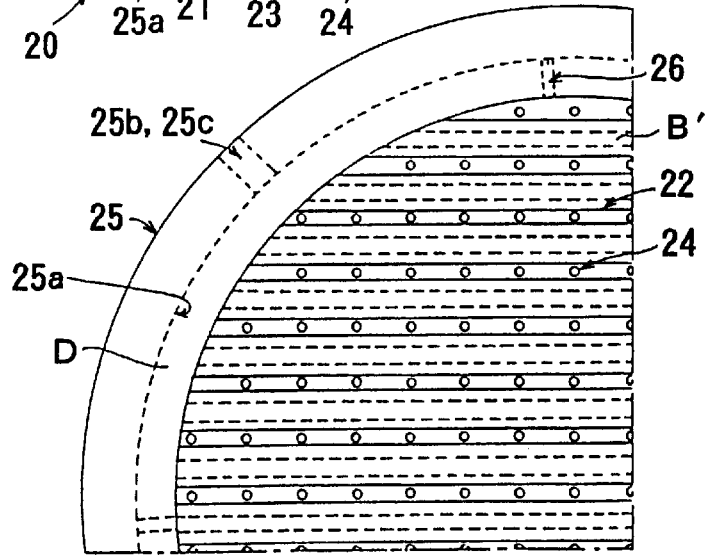
FIG. 8C is a fragmentary bottom view of the gas ejection head shown in FIG. 8A.

FIGS. 8A, 8B, and 8C illustrate a gas ejection head according to an embodiment of the present invention. As shown in FIGS. 8A, 8B, and 8C, the gas ejection head includes a nozzle head body 20 which comprises a disk 21 having a plurality of parallel fitting grooves 21a defined in an upper surface thereof and a plurality of parallel fitting grooves 21a defined in a lower surface thereof. The fitting grooves 21a defined in the upper and lower surfaces of the disk 21 extend perpendicularly to each other. Slender liquid passage members 22, each having a channel-shaped cross section defining a liquid passage groove 23, are fitted in the respective fitting grooves 21a defined in the upper and lower surfaces of the disk 21, with the liquid passage grooves 23 opening toward the bottoms of the fitting grooves 21a.

The liquid passage grooves 23 and the bottoms of the fitting grooves 21a jointly define heating liquid medium passages B, B' for a heating liquid medium such as oil to flow therethrough. The disk 21 also has a plurality of nozzle orifices 24 defined in ridges between the fitting grooves 21a in the upper and lower surfaces thereof. The nozzle orifices 24 extend through the disk 21 between the upper and lower surfaces thereof, for ejecting a mixture of material and oxide gases therethrough. The liquid passage members 22 are hermetically welded to the disk 21 to provide a complete seal between material gas passages C including the nozzle orifices 24 and the heating liquid medium passages B, B'. Since the liquid passage members 22 are hermetically welded to the disk 21 uniformly over the upper and lower surfaces thereof, any warpage of the disk 21 toward one side thereof due to the heat generated by the welding process is minimized.

An annular common liquid passage member 25 is fixedly fitted around the disk 21. The annular common liquid passage member 25 has a common liquid passage groove 25a defined in an inner circumferential surface thereof and providing a heating liquid medium passage D from and into which the heating liquid medium flows. The annular common liquid passage member 25 is hermetically welded to the disk 21 to provide a complete seal between the heating liquid medium passage D and the material gas passages C. The heating liquid medium passage D is held in communication with the upper and lower heating liquid medium passages B, B'. Partitions 26 for partitioning the heating liquid medium passage D are disposed in the common liquid passage groove 25a at angularly spaced locations. The annular common liquid passage member 25 has an inlet port 25b and an outlet port 25c for the heating liquid medium which are defined at angularly spaced positions therein. The inlet port 25b and the outlet port 25c have outer ends that are open at an outer circumferential surface of the annular common liquid passage member 25 and inner ends held in communication with the heating liquid medium passage D.

Figure 9:
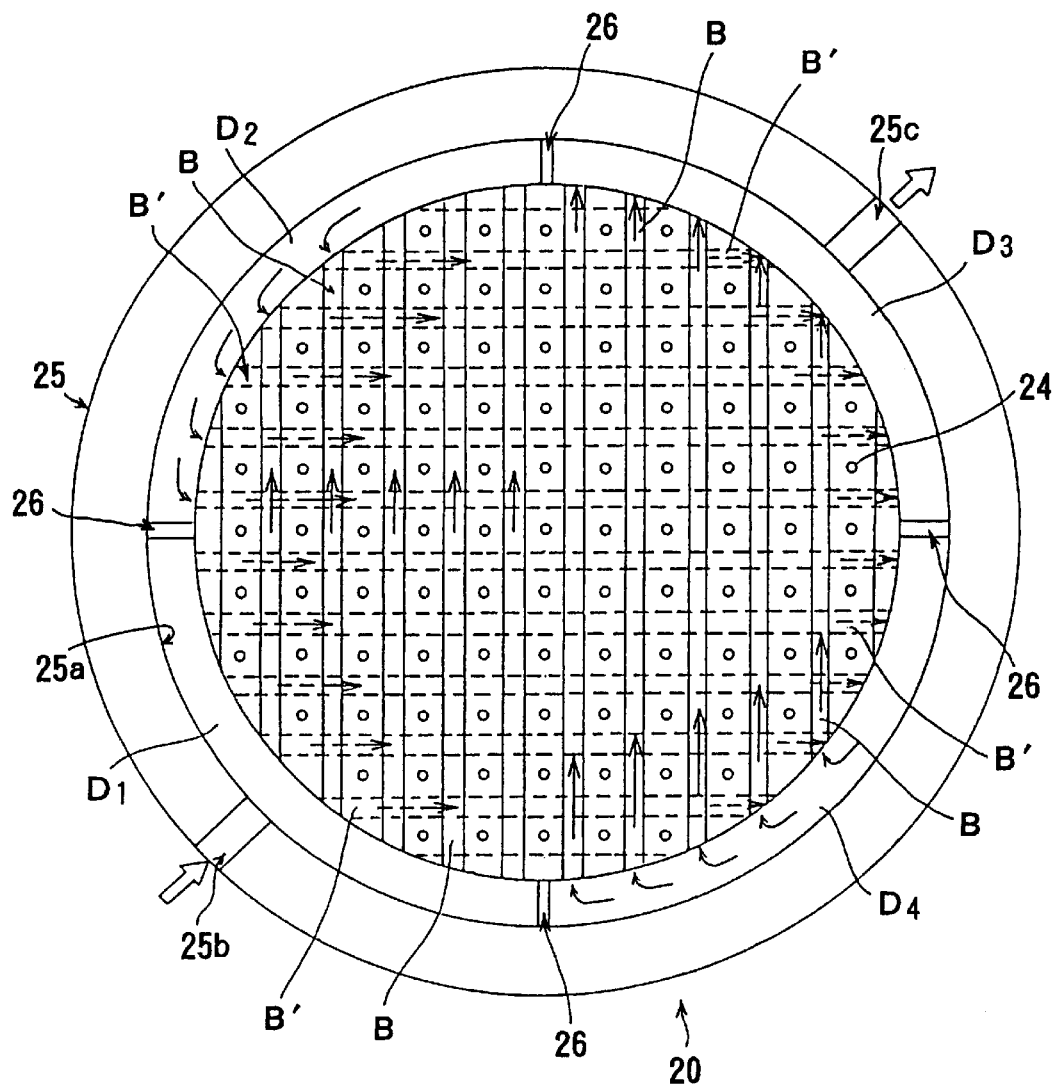
FIG. 9 is a plan view of the gas ejection head shown in FIGS. 8A, 8B, 8C, showing a flow pattern of a heating liquid medium therein.

FIG. 9 shows in plan a flow pattern of the heating liquid medium in the nozzle head body 20 shown in FIGS. 8A, 8B, 8C. In FIG. 9, the heating liquid medium passages B, indicated by the solid lines, are defined by the liquid passage grooves 23 in the liquid passage members 22 on the upper surface of the disk 21, and the heating liquid medium passages B', indicated by the broken lines, are defined by the liquid passage grooves 23 in the liquid passage members 22 on the lower surface of the disk 21. There are four partitions 26 disposed in the common liquid passage groove 25a at 90°-spaced positions, dividing the heating liquid medium passage D into four sections D1, D2, D3, D4.

The heating liquid medium that has been introduced from the inlet port 25b into the section D1 of the heating liquid medium passage D flow through the upper heating liquid medium passages B toward the section D2 thereof as indicated by the solid-line arrows, and also flows through the lower heating liquid medium passages B' toward the section D4 thereof as indicated by the broken-line arrows. The heating liquid medium that has flowed into the section D2 enters the lower heating liquid medium passages B' and flows toward the section D3 as indicated by the broken-line arrows, and the heating liquid medium that has flowed into the section D4 enters the upper heating liquid medium passages B and flows toward the section D3 as indicated by the solid-line arrows. The heating liquid medium flows into the section D3 and is then discharged through the outlet pot 25c. Therefore, the heating liquid medium introduced from the inlet port 25b flows through both the upper and lower heating liquid medium passages B, B' for heating the gas ejection head 10 efficiently in its entirety.

Figure 10:
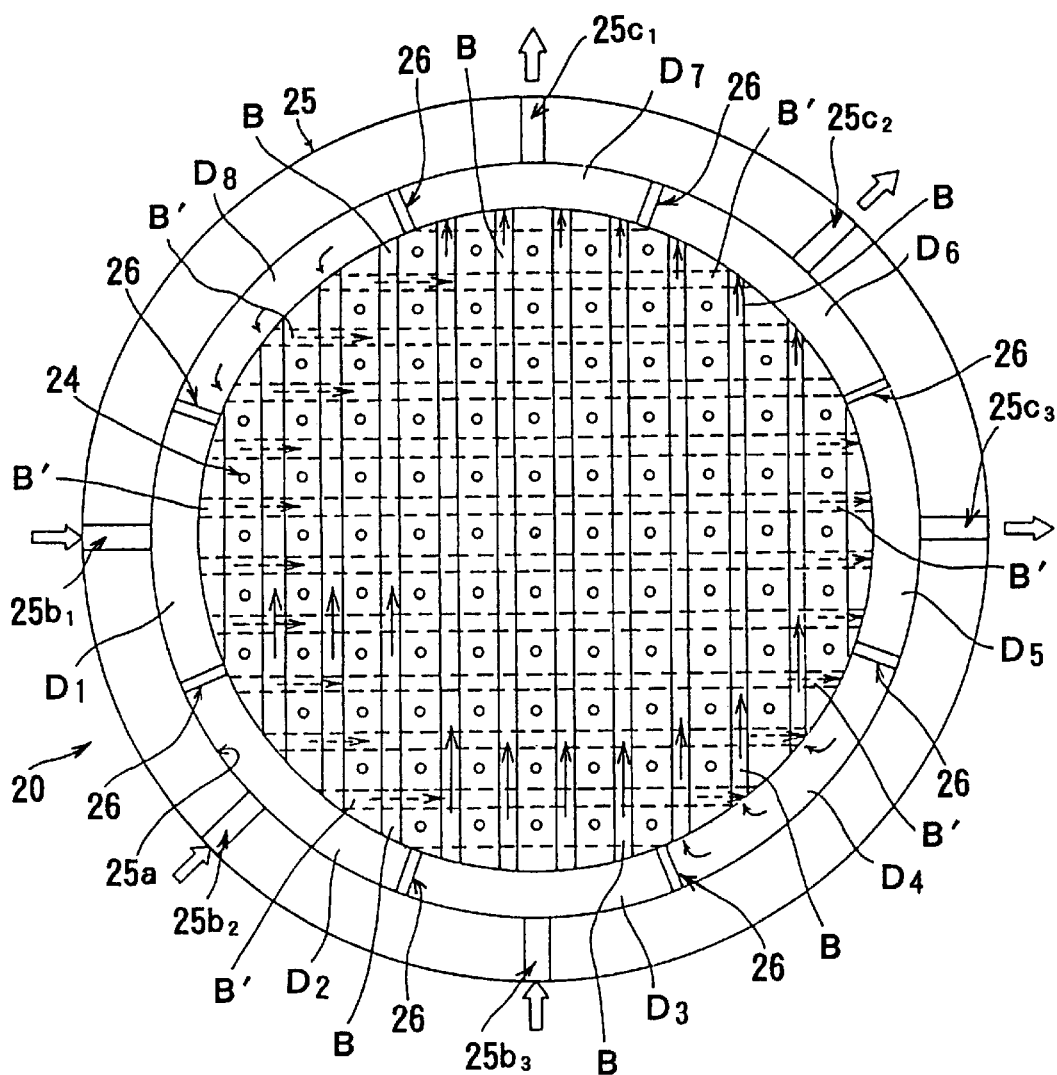
FIG. 10 is a plan view of a gas ejection head according to another embodiment of the present invention, showing a flow pattern of a heating liquid medium therein.

FIG. 10 illustrates in plan a gas ejection head according to another embodiment of the present invention, showing a flow pattern of a heating liquid medium therein. The gas ejection head shown in FIG. 10 has a nozzle head body 20 which differs from the nozzle head body 20 of the gas ejection head shown in FIG. 9 in that there are eight partitions 26 disposed in the common liquid passage groove 25a at 45°-spaced positions, dividing the heating liquid medium passage D into eight sections D1, D2, D3, D4, D5, D6, D7, D8. Three inlet ports 25b1, 25b2, 25b3 are defined in the annular common liquid passage member 25 in communication with the sections D1, D2, D3, respectively, and three outlet ports 25c1, 25c2, 25c3 are defined in the annular common liquid passage member 25 in communication with the sections D5, D6, D7, respectively.

As shown in FIG. 10, the heating liquid medium that has been introduced from the inlet port 25b1 into the section D1 flows through the lower heating liquid medium passages B' into the section D5, from which the heating liquid medium is discharged from the outlet port 25c3. The heating liquid medium that has been introduced from the inlet port 25b2 into the section D2 flows through the upper heating liquid medium passages B into the section D8, from which the heating liquid medium flows through the lower heating liquid medium passages B' into the section D6, from which the heating liquid medium is discharged from the outlet port 25c2. The heating liquid medium that has been introduced from the inlet port 25b2 into the section D2 also flows through the lower heating liquid medium passages B' into the section D4, from which the heating liquid medium flows through the upper heating liquid medium passages B into the section D6, from which the heating liquid medium is discharged from the outlet port 25c2. The heating liquid medium that has been introduced from the inlet port 25b3 into the section D3 flows through the upper heating liquid medium passages B into the section D7, from which the heating liquid medium is discharged from the outlet port 25c1.

Figure 11:
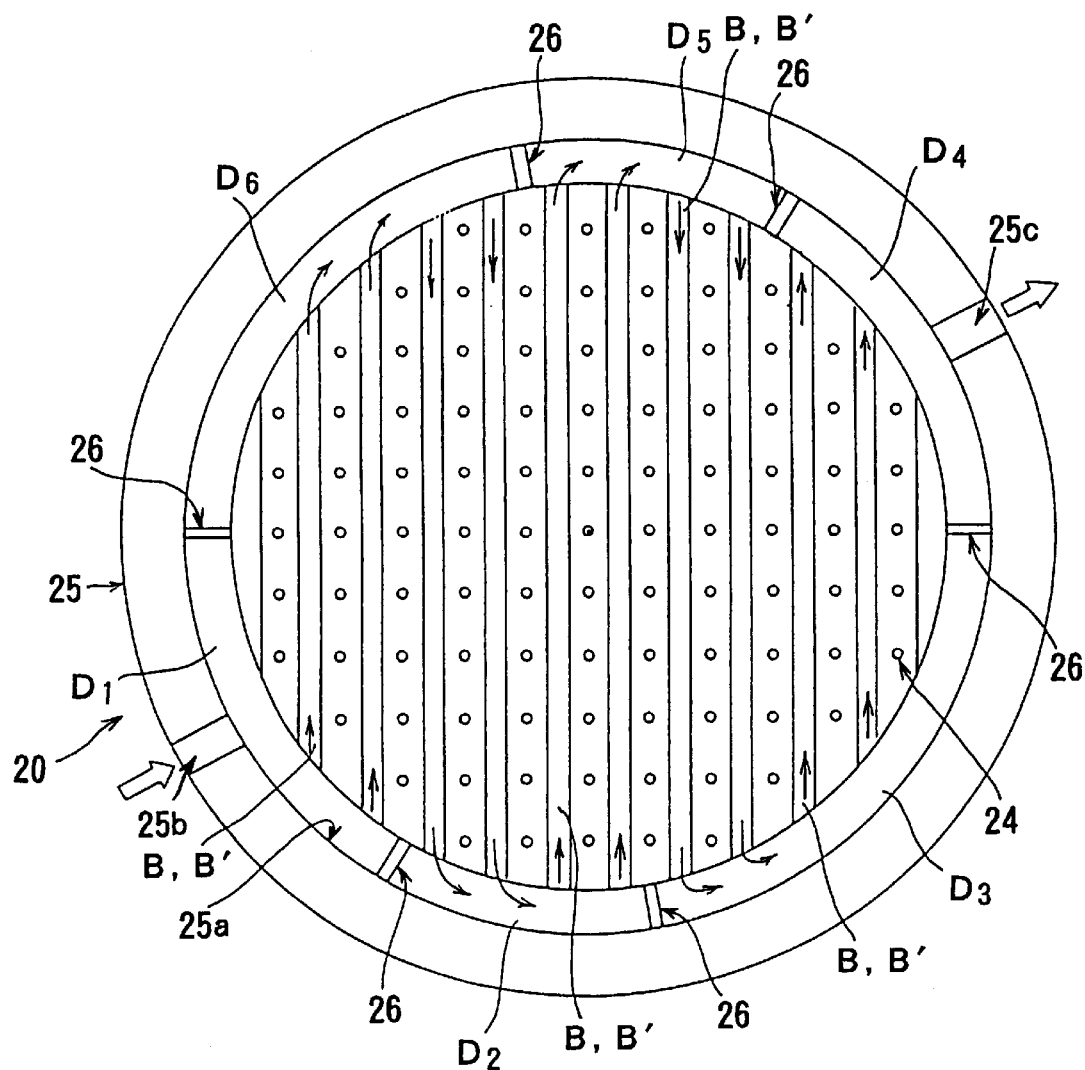
FIG. 11 is a plan view of a gas ejection head according to still another embodiment of the present invention, showing a flow pattern of a heating liquid medium therein.

FIG. 11 illustrates in plan a gas ejection head according to still another embodiment of the present invention, showing a flow pattern of a heating liquid medium therein. The gas ejection head has a nozzle head body 20 shown in FIG. 11 which differs from the nozzle head body 20 of the gas ejection head shown in FIG. 9 in that the upper and lower heating liquid medium passages B, B' extend in the same direction, and there are six partitions 26 disposed in the common liquid passage groove 25a, dividing the heating liquid medium passage D into six sections D1, D2, D3, D4, D5, D6, with the inlet port 25b communicating with the section D1 and the outlet port 25c with the section D4.

As shown in FIG. 11, the heating liquid medium that has been introduced from the inlet port 25b into the section D1 flows through the upper and lower heating liquid medium passages B, B' into the section D6, from which the heating liquid medium flows through the upper and lower heating liquid medium passages B, B' into the section D2. Then, the heating liquid medium flows through the upper and lower heating liquid medium passages B, B' into the section D5, from which the heating liquid medium flows through the upper and lower heating liquid medium passages B, B' into the section D3. Thereafter, the heating liquid medium flows from the section D3 through the upper and lower heating liquid medium passages B, B' into the section D4, from which the heating liquid medium is discharged from the outlet port 25c.

Figure 12A:
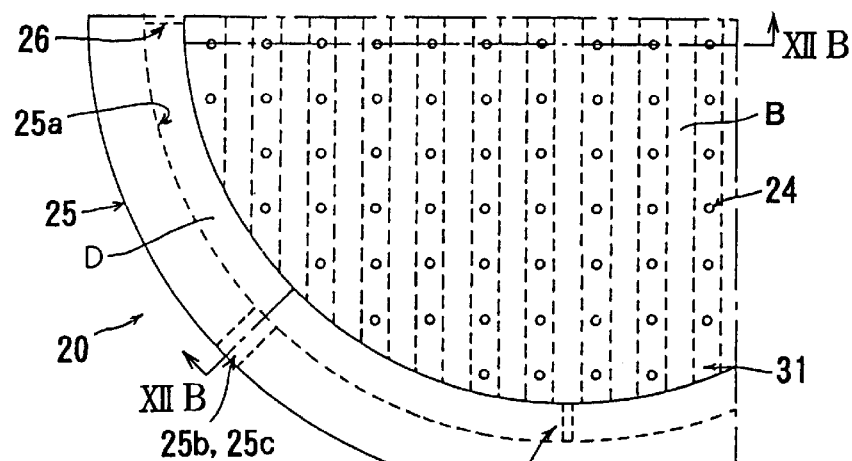
FIG. 12A is a fragmentary plan view of a gas ejection head according to yet still another embodiment of the present invention.
Figure 12B:
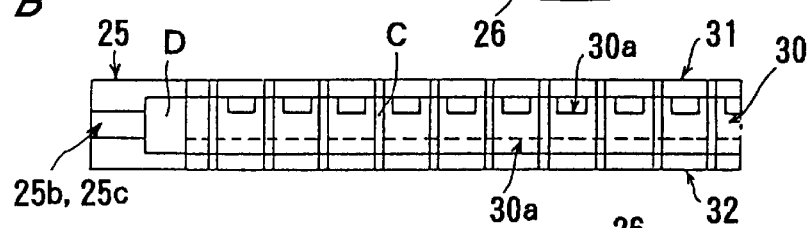
FIG. 12B is a cross-sectional view taken along line XIIB—XIIB of FIG. 12A.
Figure 12C:
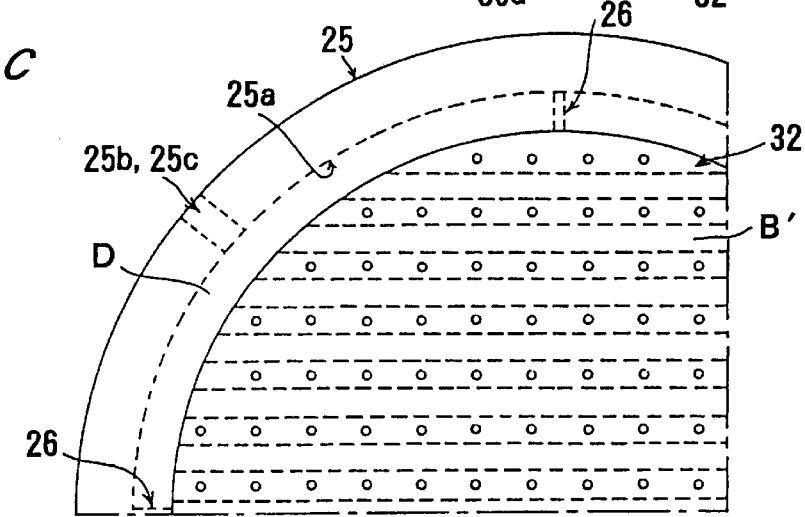
FIG. 12C is a fragmentary bottom view of the gas ejection head shown in FIG. 12A.

FIGS. 12A, 12B, 12C illustrate a gas ejection head according to yet still another embodiment of the present invention. As shown in FIGS. 12A, 12B, and 12C, the gas ejection head includes a nozzle head body 20 which comprises a disk 30 having a plurality of parallel liquid passage grooves 30a defined in an upper surface thereof, and a plurality of parallel liquid passage grooves 30a defined in a lower surface thereof. The liquid passage grooves 30a defined in the upper and lower surfaces of the disk 30 extend perpendicularly to each other. Similar disks 31, 32 are joined respectively to the upper and lower surfaces of the disk 30.

The liquid passage grooves 30a defined in the upper surface of the disk 30 and the disk 31 jointly define upper heating liquid medium passages B, and the liquid passage grooves 30a defined in the lower surface of the disk 30 and the disk 32 jointly define lower heating liquid medium passages B'. The disk 30 also has a plurality of nozzle orifices 24 defined in ridges between the liquid passage grooves 30a in the upper and lower surfaces thereof. The nozzle orifices 24 extend through the disk 30 and also the disks 31, 32 between the upper and lower surfaces thereof, for ejecting a mixture of material and oxide gases therethrough. The disk 30 and the upper and lower disks 31, 32 are hermetically joined by a thermal diffusion joining process to provide a complete seal between material gas passages C including the nozzle orifices 24 and the heating liquid medium passages B, B'.

An annular common liquid passage member 25 is fixedly fitted around the disks 30, 31, 32. The annular common liquid passage member 25 has a common liquid passage groove 25a defined in an inner circumferential surface thereof and which provides a heating liquid medium passage D from and into which the heating liquid medium flows. The annular common liquid passage member 25 is hermetically joined by a thermal diffusion joining process to the disk 31, 32 to provide a complete seal between the heating liquid medium passage D and the material gas passages C. The heating liquid medium passage D is held in communication with the upper and lower heating liquid medium passages B, B'. Partitions 26 for partitioning the heating liquid medium passage D are disposed in the common liquid passage groove 25a at angularly spaced locations. The annular common liquid passage member 25 has an inlet port 25b and an outlet port 25c for the heating liquid medium which are defined at angularly spaced positions therein. The inlet port 25b and the outlet port 25c have outer ends that are open at an outer circumferential surface of the annular common liquid passage member 25 and inner ends held in communication with the heating liquid medium passage D.

The heating liquid medium may flow in the nozzle head body 20 shown in FIGS. 12A, 12B, 12C in substantially the same pattern as shown in FIGS. 9 and 10. If the upper and lower heating liquid medium passages B, B' extend in the same direction, the heating liquid medium may flow in substantially the same pattern as shown in FIG. 11. The nozzle head body 20 shown in FIGS. 12A, 12B, 12C is simpler in structure than the nozzle head body 20 shown in FIGS. 8A, 8B, 8C.

The upper and lower heating liquid medium passages B, B', the heating liquid medium passage D extending therearound, and the partitions 26 dividing the heating liquid medium passage D, as shown in FIGS. 8A, 8B, 8C through FIGS. 12A, 12B, 12C, are effective to control the directions in which the heating liquid medium flows from the inlet port toward the outlet port through the nozzle head body 20.

Inasmuch as the heating liquid medium passages through which the heating liquid medium flows in the nozzle head body 20 are separated into the upper and lower groups B, B', the heating liquid mediums flowing respectively through the upper and lower groups B, B' of the heating liquid medium passages may be individually controlled in temperature. Therefore, it is possible to use the upper heating liquid medium passages B to keep an upstream portion of the nozzle head body 20 heated, and use the lower heating liquid medium passages B' to prevent the nozzle head body 20 from being heated by radiant heat applied from the heater that is disposed below the nozzle head body 20 in the vapor-phase film growth apparatus.

Figure 13A:
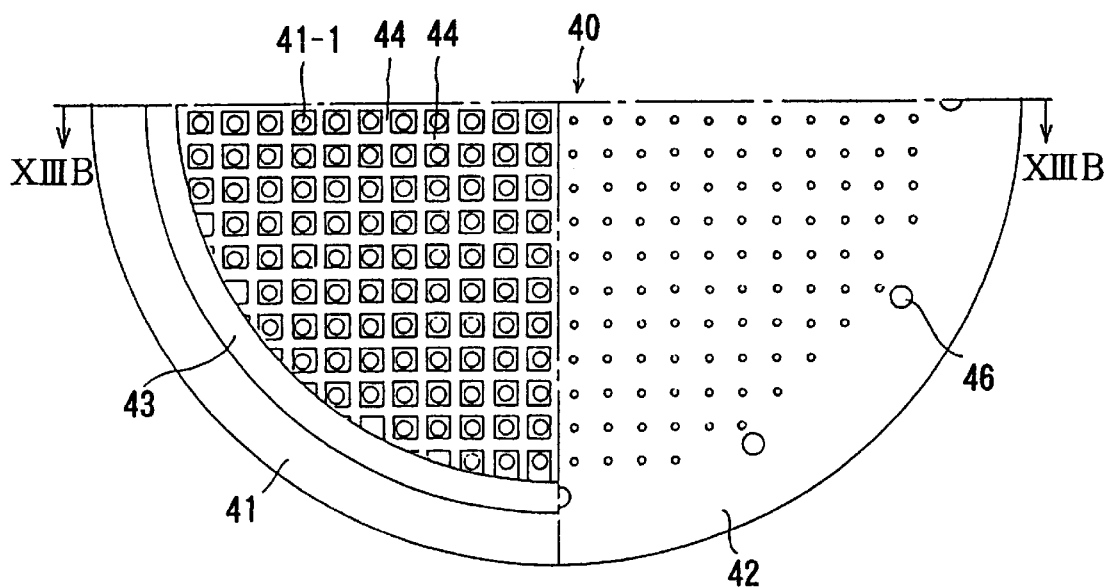
FIG. 13A is a fragmentary plan view of a gas ejection head according to a further embodiment of the present invention.
Figure 13B:
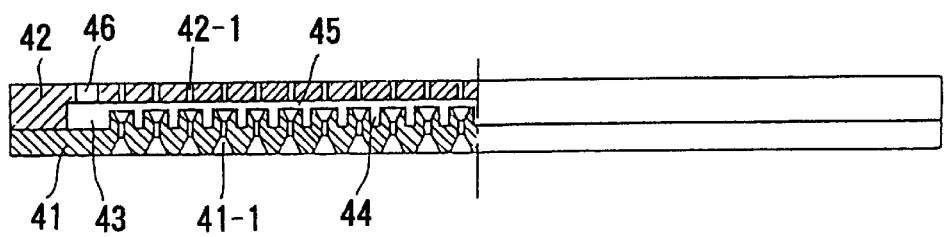
FIG. 13B is a cross-sectional view taken along line XIIIB—XIIIB of FIG. 13A.

FIGS. 13A, 13B, 14, 15 show a gas ejection head according to a further embodiment of the present invention. As shown in FIGS. 13A, 13B, the gas ejection head includes a nozzle head body 40 which comprises a rear nozzle disk 41 and a front nozzle disk 42 which are coupled to each other. The rear nozzle disk 41 has a plurality of rear nozzle orifices 41-1 defined therein, and the front nozzle disk 42 has a plurality of front nozzle orifices 42-1 defined therein.

The rear nozzle disk 41 and the front nozzle disk 42 define therebetween an annular gas passage 43 extending in an outer circumferential region of the nozzle head body 40. The rear nozzle disk 41 has a grid-like pattern of vertical and horizontal gas passages 44 defined in an upper surface thereof in communication with the annular gas passage 43. The rear nozzle orifices 41-1 are defined centrally in respective lands of the rear nozzle disk 41 that are surrounded by the vertical and horizontal gas passages 44. The front nozzle orifices 42-1 are positioned in vertical alignment with, (i.e., directly above) the rear nozzle orifices 41-1, respectively.

The rear nozzle disk 41 and the front nozzle disk 42 are joined to each other along their outer circumferential edges, and define therebetween a gap 45 of predetermined dimensions through which the gas passages 44 communicate with the annular gas passage 43. Alternatively, the rear nozzle disk 41 and the front nozzle disk 42 may define therebetween a plurality of grooves through which the gas passages 44 communicate with the annular gas passage 43. The front nozzle disk 42 has a plurality of gas supply ports 46 defined therein along its outer circumferential edge and held in communication with the annular gas passage 43.

Figure 15:
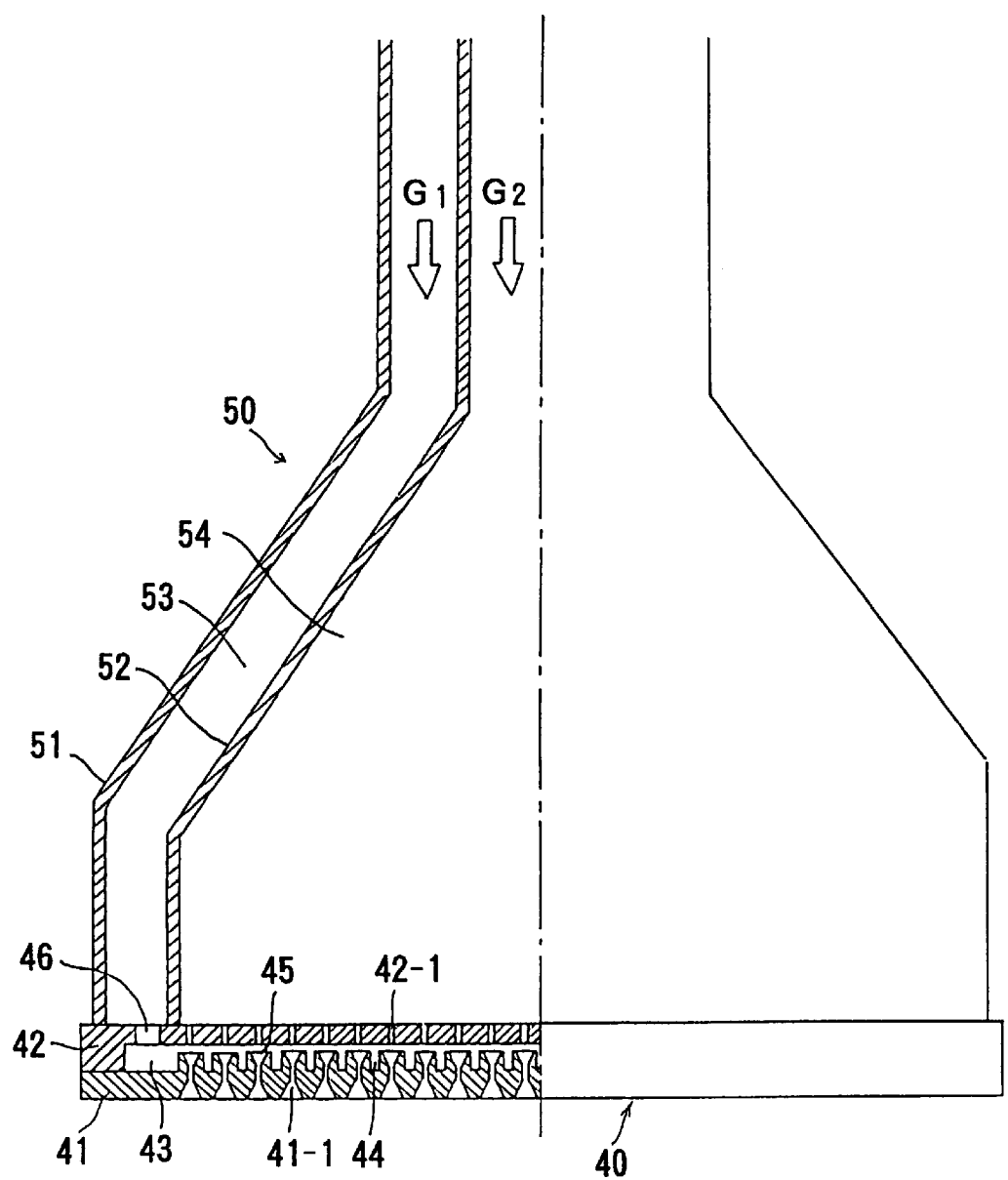
FIG. 15 is a side elevational view, partly in cross section, of the gas ejection head shown in FIGS. 13A and 13B.

As shown in FIG. 15, the gas ejection head also comprises a gas supply head unit 50 of a double-walled structure having an outer tube 51 and an inner tube 52. The front nozzle disk 42 of the nozzle head body 40 is joined to lower ends of the outer tube 51 and the inner tube 52. The annular gas passage 43 communicates through the gas supply ports 46 with a chamber 53 defined between the outer tube 51 and the inner tube 52. The front nozzle orifices 42-1 are open directly into a chamber 54 defined in the inner tube 52.

The gas ejection head operates as follows: When an oxide gas G1 is supplied to the chamber 53 defined between the outer tube 51 and the inner tube 52, and a material gas G2 is supplied to the chamber 54 in the inner tube 52, the oxide gas G1 flows from the chamber 53 through the gas supply ports 46 into the annular gas passage 43, from which the oxide gas G1 flows through the gas passages 44 radially inwardly into the gap 45.

The material gas G2 flows from the chamber 24 through the front nozzle orifices 42-1 into the gap 45. The material gas G2 and the oxide gas G1 flow from the gap 45 into the rear nozzle orifices 41-1, in which the material gas G2 and the oxide gas G1 are mixed with each other into a mixture gas. The mixture gas is then ejected through diffusers 41-1a (described below) of the rear nozzle orifices 41-1 into the film deposition chamber (not shown), below the nozzle head body 40, of the vapor-phase film growth apparatus.

As shown in FIG. 14, each of the rear nozzle orifices 41-1 includes an upper conical inlet section 41-1b that is open into the gap 45 and a lower conical diffuser 41-1a that is open at the lower surface of the rear nozzle disk 41.

The oxide gas G1 introduced from the chamber 53 flows through the gas supply ports 46, the annular gas passage 43, and the gas passages 44 as an oxide gas g1 into the upper conical inlet section 41-1b of each of the rear nozzle orifices 41-1 from an outer circumferential edge of the upper conical inlet section 41-1b. The gap 45 above the outer circumferential edge of the upper conical inlet section 41-1b serves as an oxide gas inlet region (intermediate gas inlet region). At the same time, the material gas G2 introduced from the chamber 44 in the inner tube 52 flows through the front nozzle orifices 42-1 as a material gas g2 centrally into the upper conical inlet section 41-1b of each of the rear nozzle orifices 41-1. The oxide gas g1 and the material gas g2 are mixed with each other into a mixture gas g3 while they are flowing through the rear nozzle orifice 41-1, and the mixture gas g3 is then discharged from the lower conical diffuser 41-1a into the film deposition chamber below the nozzle head body 40.

Since the oxide gas g1 flows into the upper conical inlet section 41-1b from the outer circumferential edge thereof, the oxide gas g1 is efficiently mixed with the material gas g2 in the rear nozzle orifice 41-1. A minimum cross-sectional area A3 (see FIG. 16) through which the oxide gas g1 flows from the gap 45 into the upper conical inlet section 41-1b from the outer circumferential edge thereof may be reduced thereby to set the pressure of the oxide gas g1 to a high level. Then the material gas g2 is prevented from flowing into the region where the oxide gas g1 flows from the gap 45 into the upper conical inlet section 41-1b. Specifically, as shown in FIG. 16, if the oxide gas g1 flows from the gap 45 into the upper conical inlet section 41-1b from the entire outer circumferential edge thereof, then the minimum cross-sectional area A3 can be determined by multiplying the length ($2^1 r$, r represents the radius of the outer circumferential edge of the upper conical inlet section 41-1b) of the outer circumferential edge of the upper conical inlet section 41-1b by the thickness (Æt) of the gap 45 (A3=$2^1 r$ ×Æt). Therefore, the minimum cross-sectional area A3 may be made sufficiently smaller than a minimum cross-sectional area A2 of the rear nozzle orifice 41-1 by either reducing the thickness (Æt) of the gap 45 or making the gap 15 open into a portion of the outer circumferential edge of the upper conical inlet section 41-1b thereby to set the pressure of the oxide gas g1 to a high level. In this manner, the material gas g2 is prevented from flowing into the region where the oxide gas g1 flows from the gap 45 into the upper conical inlet section 41-1b.

For uniformly distributing the material gas g2, a minimum cross-sectional area A1 of each of the front nozzle orifices 42-1 may be made smaller than the minimum cross-sectional area A2 of the rear nozzle orifice 41-1, and the minimum cross-sectional area A2 may be made sufficiently greater than the sum of the minimum cross-sectional area A1 and the minimum cross-sectional area A3 thereby to prevent the oxide gas g1 from flowing into the chamber 54 in the inner tube 52. Therefore, these minimum cross-sectional areas A1, A2, A3 may be selected to satisfy the following inequalities: A3<A2, A1<A2, A1+A3<A2. The minimum cross-sectional area A2 should not be too large in order to increase the efficiency with which to mix the material gas g2 and the oxide gas g1 with each other. If, however, minimum cross-sectional area A2 cannot be sufficiently small, then the rear nozzle orifice 41-1 may be increased in length to increase the efficiency with which to mix the material gas g2 and the oxide gas g1 with each other.

As described above, the oxide gas G1 introduced from the chamber 43 flows from the gas supply ports 16 into the annular gas passage 43 and then flows as the oxide gas g1 through the gas passages 44 into the gap 45. The oxide gas g1 then flows uniformly into the rear nozzle orifices 41-1 through the upper conical inlet sections 41-1b thereof from their outer circumferential edges. The oxide gas g1 is uniformly distributed into the nozzle head body 40 by making the conductance of the gas passages 44 sufficiently large and also making the conductance of the intermediate gas inlet regions (the upper conical inlet sections 41-1b) sufficiently smaller than the conductance of the gas passages 44.

When the minimum cross-sectional area A2 of the rear nozzle orifices 41-1, the minimum cross-sectional area A2 of the front nozzle orifices 42-1, and the minimum cross-sectional area A3 of the intermediate gas inlet regions are reduced until a choked phenomenon is caused in these areas, i.e., the speeds of the gas flows become M (Mach)=1 or more, the material gas g2 is uniformly ejected from the front nozzle orifices g1, the oxide gas g1 is uniformly ejected from the intermediate gas inlet regions, and the mixture gas g3 is uniformly ejected from the rear nozzle orifices 41-1.

The choking phenomenon will be described below with respect to the front nozzle orifice 42-1 of the front nozzle disk 42 as shown in FIG. 17. If the minimum cross-sectional area of the front nozzle orifice 42-1 is reduced until the speed of the gas flowing through the front nozzle orifice 42-1 becomes M (Mach)=1 or more, then a mass flow $m_c$ (kg/s) of the gas that flows at this time is determined as follows:

$$F_c \leq m_c / [\{2/(k+1)\}^{1/(k-1)} \{k/(k+1)\}^{1/2} \{2(p_1/v_1)\}^{1/2}] \quad (1)$$

where $F_c$: the minimum cross-sectional area (m²) of the front nozzle orifice 42-1;

k: ratio of specific heats;

$p_1$: the pressure (pa) of the gas at the gas inlet side of the front nozzle orifice 42-1; and $v_1$: the specific volume (m³/kg) of the gas at the gas inlet side of the front nozzle orifice 42-1.

A structural factor is the minimum cross-sectional area $F_c$ (m²), and the mass flow $m_c$ (kg/s) per minimum cross-sectional area is determined only from the minimum cross-sectional area $F_c$ and the pressure $p_1$ of the gas at the gas inlet side.

Whether or not the speed of the gas flowing through the front nozzle orifice 42-1 is M (Mach)=1 or more is determined by the ratio of the pressure $p_1$ of the gas at the gas inlet side to the pressure $p_2$ of the gas at the gas outlet side of the front nozzle orifice 42-1. If the pressure ratio is equal to or lower than a Laval pressure ratio $p^*/p_1$ where $p^*$ is the pressure in the minimum cross-sectional area of the front nozzle orifice 42-1, then M $^3$ 1. The Laval pressure ratio $p^*/p_1$ is given dependent on the ratio k of specific heats as follows (see page 166, "Mechanical thermodynamics", 7th edition, written by Morio Tsuge, published Mar. 20, 1973, Asakura Shoten):

k=1.2 k=1.3 k=1.4 k=1.67 $p^*/p_1$ 0.5644 0.5457 0.5283 0.4867

If the gas pressure at the gas outlet side of the front nozzle orifice 42-1 is represented by $p_2$, and the Laval pressure ratio $p^*/p_1$ is 0.5, then a) when $p_1=2$ (pa) and $p_2=2$ (pa), the speed of the gas is zero, b) when $p_1=2$ (pa) and $p_2=1.5$ (pa), the speed of the gas is subsonic, c) when $p_1=2$ (pa) and $p_2=1$ (pa), the speed of the gas is M=1 at the throat of the front nozzle orifice 42-1, and $p^*=p_2$, when the pressure $p_2$ is lowered from the conditions c) to conditions d), i.e., d) when $p_1=2$ (pa) and $p_2=0.5$ (pa), the speed of the gas is M=1 at the throat of the front nozzle orifice 42-1, and M>1 at the gas outlet side of the front nozzle orifice 42-1 if the front nozzle orifice 42-1 is a de Laval tube, and $p^*=1$ (pa) and $p_2=0.5$ (pa).

It can be seen from c) and d) that when $p_2/p_1 > 0.5$, the speed $M \ne 1$ is assured at the gas outlet side of the front nozzle orifice 42-1. When M=1 ($p^*=p_2$), a boundary condition is satisfied, and $(p_2/p_1)=(p^*/p_1)=0.5$. Therefore, when $p_2<p^*$, the speed of the gas is $M \ne 1$ at the gas outlet side of the front nozzle orifice 42-1.

When the above state (choked state) is created in a front nozzle orifice 42-1, the rate of the gas flowing through the front nozzle orifice 42-1 is determined only by the gas pressure $p_1$ at the gas inlet side of the front nozzle orifice 42-1 (strictly, by the pressure pi and the specific volume $v_1$ of the gas at the gas inlet side of the front nozzle orifice 42-1). An excess gas that cannot flow out of the front nozzle orifice 42-1 in the choked state flows out of another front nozzle orifice 42-1 which has not been in the choked state, whereupon the other front nozzle orifice 42-1 is in the choked state. In this manner, all the front nozzle orifices 42-1 are brought into the choked state.

According to the above process, the gas flow through all the front nozzle orifices 42-1 is choked. If the gas ejection head is of such a structure that the gas pressures $p_1$ at the gas inlet sides of the front nozzle orifices 42-1 are substantially equalized in the chamber 54, then the mass flows $m_c$ (kg/s) of the gas from all the front nozzle orifices 42-1 are necessarily identical to each other, allowing the gas to be uniformly ejected from the gas ejection head.

Since the same phenomenon holds true for the intermediate gas inlet regions, the gas flow through the intermediate gas inlet regions may also be choked. If a necessary rate of flow of the gas is not achieved when all the gas passages through the nozzle orifices are choked, then the gas pressure $p_1$ at the gas inlet sides may be increased to increase the mass flow $m_c$ until finally the gas flows at the necessary rate.

Figure 18A:
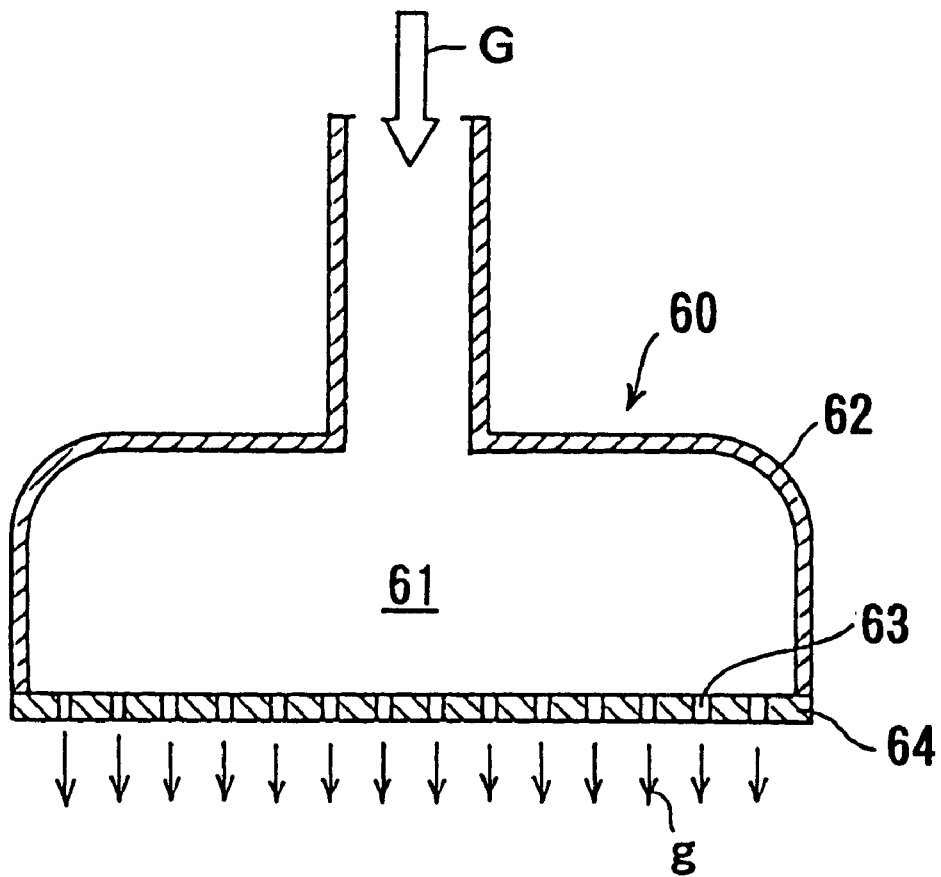
FIG. 18A is a cross-sectional view of a gas ejection head according to an embodiment of the present invention.
Figure 18B:
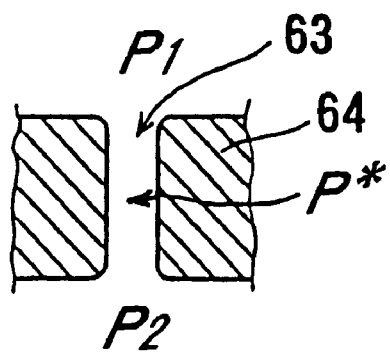
FIG. 18B is an enlarged fragmentary cross-sectional view of an orifice of the gas ejection head shown in FIG. 18A.

FIGS. 18A and 18B show a gas ejection head 60 according to an embodiment of the present invention. As shown in FIGS. 18A and 18B, the gas ejection head 60 comprises a head housing 62 with a chamber 61 defined therein and a head nozzle plate 64 having a plurality of nozzle orifices 63 defined therein. When a gas G is supplied from a supply pipe to the chamber 61, a gas g is ejected from the nozzle orifices 63 of the head nozzle plate 64.

For uniformly ejecting the gas from the gas ejection head 60, a resistance is not placed in the nozzle orifices 63, but the diameter of each of the nozzle orifices 63 is reduced until the speed of the gas flowing through the nozzle orifices 63 becomes M (Mach)=1 or more. A mass flow $m_c$ (kg/s) of the gas flowing through each of the nozzle orifices 63 at this time is determined as follows:

$$F_c \le m_c/[\{2/(k+1)\}^{1/(k-1)}\{k/(k+1)\}^{1/2}\{2(p_1/v_1)\}^{1/2}] \qquad (1)$$

were $F_c$: the minimum cross-sectional area (m$^2$) of the nozzle orifice 63;

k: ratio of specific heats (constant dependent on the gas);

$p_1$: the pressure (pa) of the gas at the gas inlet side of the nozzle orifice 63; and $v_1$: the specific volume (m$^3$/kg) of the gas at the gas inlet side of the nozzle orifice 63.

A structural factor is the minimum cross-sectional area $F_c$ (m$^2$) of the nozzle orifice 63, and the mass flow $m_c$ (kg/s) per orifice is structurally determined only from the minimum cross-sectional area $F_c$ regardless of the configuration of the nozzle orifice 63 by the following equation (2):

$$m_c = F_c\{2/(k+1)\}^{1/(k-1)}\{k/(k+1)\}^{1/2}\{2(p_1/v_1)\}^{1/2} \qquad (2)$$

where k: ratio of specific heats (constant dependent on the gas);

$p_1$: the pressure (pa) of the gas at the gas inlet side of the nozzle orifice 63; and $v_1$: the specific volume (m$^3$/kg) of the gas at the gas inlet side of the nozzle orifice 63.

Whether or not the speed of the gas flowing through the nozzle orifice 63 is M (Mach)=1 or more is determined by the ratio of the pressure $p_1$ of the gas at the gas inlet side to the pressure p2 of the gas at the gas outlet side of the nozzle orifice 63. If the pressure ratio is equal to or lower than a Laval pressure ratio $p^*/p_1$ where $p^*$ is the pressure in the minimum cross-sectional area of the nozzle orifice 63, then $M \ne 1$. The Laval pressure ratio $p^*/p_1$ is given dependent on the ratio k of specific heats as follows (see the above literature):

k=1.2 k=1.3 k=1.4 k=1.67 $p^*/p_1$ 0.5644 0.5457 0.5283 0.4867

If the gas pressure at the gas outlet side of the nozzle orifice 63 is represented by $p_2$, and the Laval pressure ratio $p^*/p_1$ is 0.5, then a) when $p_1=2$ (pa) and $p_2=2$ (pa), the speed of the gas is zero at the throat of the nozzle orifice 63, b) when $p_1=2$ (pa) and $p_2=1.5$ (pa), the speed of the gas is subsonic, c) when $p_1=2$ (pa) and $p_2=1$ (pa), the speed of the gas is M=1, and $p^*=p_2$, when the pressure $p_2$ is lowered from the conditions c) to conditions d), i.e., d) when $p_1=2$ (pa) and $p_2=0.5$ (pa), the speed of the gas is M=1 in the nozzle orifice 63, and M>1 at the gas outlet side of the nozzle orifice 63 if the nozzle orifice 63 is a de Laval tube, and $p^*=1$ (pa) and $p_2=0.5$ (pa).

It can be seen from c) and d) that when $p_2/p_1 > 0.5$, the speed $M \ne 1$ is assured at the gas outlet side of the nozzle orifice 63. When M=1 ($p^*=p_2$), a boundary condition is satisfied, and $(p_2/p_1)=(p^*/p_1)=0.5$. Therefore, when $p_2<p^*$, the speed of the gas is $M \ne 1$ at the gas outlet side of the nozzle orifice 63.

When the above state (choked state) is created in a nozzle orifice 63, the rate of the gas flowing through the nozzle orifice 63 is determined only by the gas pressure $p_1$ at the gas inlet side of the nozzle orifice 63 (strictly, by the pressure $p_1$ and the specific volume $v_1$ of the gas at the gas inlet side of the nozzle orifice 63. An excessive gas that cannot flow out of the nozzle orifice 63 in the choked state flows out of another nozzle orifice 63 which has not been in the choked state, whereupon the other nozzle orifice 63 is in the choked state.

According to the above process, the gas flow through all the nozzle orifices 63 is choked. If the gas ejection head is of such a structure that the gas pressures $p_1$ at the gas inlet sides of the nozzle orifices 63 are substantially equalized in the chamber 61, then the mass flow $m_c$ (kg/s) of the gas from each the nozzle orifices 63 is necessarily identical, allowing the gas to be uniformly ejected from the gas ejection head.

If a necessary rate of flow of the gas is not achieved when all the gas passages through the nozzle orifices are choked, then the gas pressure $p_1$ at the gas inlet sides may be increased to increase the mass flow $m_c$ until finally the gas flows at the necessary rate.

When a plurality of gases are mixed together, they may be mixed upstream of the gas ejection head 60, or within the gas ejection head 60, or downstream of the gas ejection head 60. If the gases are to be mixed upstream of the gas ejection head 60, then the uniform mixing of the gases depends on the mixing performance of a region where they are mixed, and has no bearing on the mixing performance of the gas ejection head 60. The mixing performance of the gas ejection head 60 affects the uniform mixing of the gases when the gases are to be mixed within the gas ejection head 60 or downstream of the gas ejection head 60. In such cases, nozzle orifices may be provided in a plurality of arrays, the gas flow through the nozzle orifices in each of the arrays may be choked, and the gases may be mixed within or downstream of the nozzle orifices.

Figure 19A:
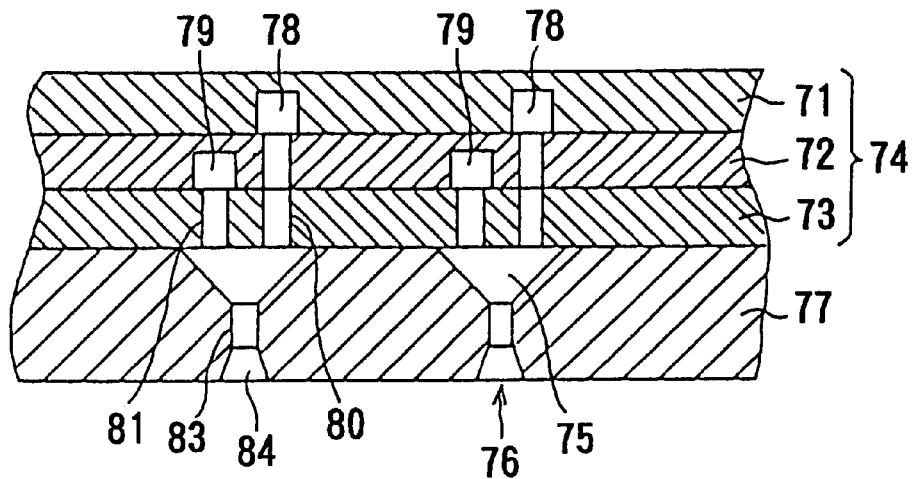
FIG. 19A is an enlarged fragmentary cross-sectional view of a gas ejection head according to another embodiment of the present invention.
Figure 19B:
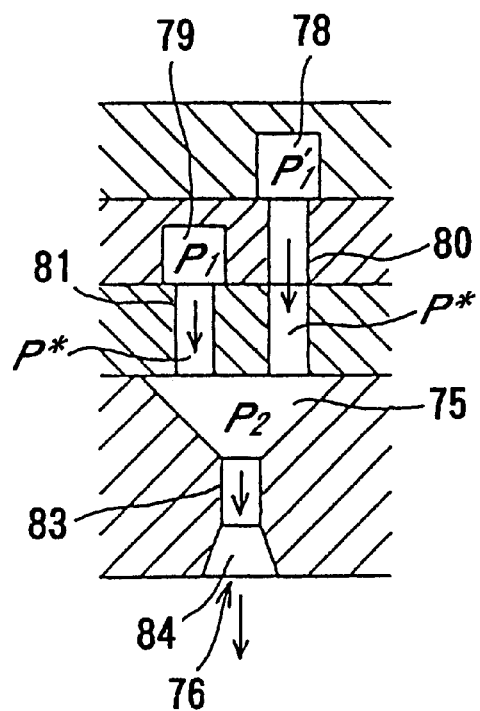
FIG. 19B is an enlarged fragmentary cross-sectional view of a nozzle structure of the gas ejection head shown in FIG. 19A.

FIGS. 19A and 19B show a gas ejection head according to another embodiment of the present invention. As shown in FIGS. 19A and 19B, the gas ejection head has a distributor 74 comprising three plates 71, 72, 73 for ejecting two different gases into a plurality of mixing chambers 75 and a nozzle plate 77 disposed underneath the distributor 74 in which the mixing chambers 75 are defined for mixing the gases.

The plate 71 has distribution passages 78 for distributing and supplying one of the two different gases, and the plate 72 has distribution passages 79 for distributing and supplying the other of the two different gases. The plates 72, 73 have through-holes 80 interconnecting the distribution passages 78 and the mixing chambers 75, and the plate 73 has through-holes 81 interconnecting the distribution passages 79 and the mixing chambers 75. The nozzle plate 77 has a plurality of through-holes or nozzle orifices 76 defined therein, and each of the orifices comprises a restriction 83 and a diffuser 84.

When a material gas is supplied from the distribution passages 78 and an oxide gas is supplied from the distribution passages 79, the material gas and the oxide gas flow through the through-holes 80, 81 into the mixing chambers 75 in which the material gas and the oxide gas are mixed with other into a mixture gas. The mixture gas then flows through the restrictions 83 and the diffusers 84 and is ejected into the film deposition chamber (not shown).

When the through-holes 80, 81 are designed to choke the gas flows therethrough, the material gas flows uniformly from the through-holes 80, and the oxide gas flows uniformly from the through-holes 81. The material gas and the oxide gas are then uniformly mixed with other in the mixing chambers 75 and the through-holes 76.

As shown in FIG. 19B, the gas flows through the through-holes 80, 81 are choked when a cross-sectional area $F_{c1}$ of the through-holes 80, 81 and a cross-sectional area $F_{c2}$ of the restriction 83 are selected to satisfy the above expression (1), and the gas pressure in the gas inlet side of the through-hole, the gas pressure in the gas outlet side of the through-hole, and the gas pressure p in the through-hole are selected to be related as follows: $(p_2/p_1)<(p*/p_1)$, $(p_2/p_1')<(p*'/p_1')$ where $p_1$, $p_1'$ represent the gas pressures in the respective distribution passages 78, 79 (i.e., in the gas inlet side), $p_2$ the gas pressure in the mixing chambers 75 (i.e., in the gas outlet side), and $p*$, $p*'$ the gas pressures in the respective through-holes 80, 81. The material gas and the oxide gas are thus uniformly mixed with each other in the mixing chambers 75 and the through-holes 76.

Although certain preferred embodiments of the present invention have been shown and described in detail, it should be understood that various changes and modifications may be made therein without departing from the scope of the appended claims.

What is claimed is:

1. A gas ejection head comprising:

a planar nozzle head body including a plurality of nozzle orifices, at least one of said nozzle orifices having a minimum cross-sectional area $F_c$ (m²) satisfying the following expression:

$$F_c \leq m_c/[\{2/(k+1)\}^{1/(k-1)}\{k/(k+1)\}^{1/2}\{2(p_1/v_1)\}^{1/2}]$$

wherein: $m_c$=the mass flow (kg/s) per orifice;

k the ratio of specific heats (a constant dependant on the gas);

$p_1$=the pressure (Pa) of the gas at the gas inlet side of the orifice; and $v_1$=the specific volume (m³/kg) of the gas at the gas inlet side of the nozzle orifice.

2. The gas ejection head of claim 1, wherein said plurality of nozzle orifices are formed so as to uniformly eject a first gas and a second gas therethrough, and said planar nozzle head body being formed such that the first gas and the second gas are mixed therein prior to ejection.

3. The gas ejection head of claim 1, wherein said plurality of nozzle orifices are formed so as to generate a flow of ejected gas such that the flow of ejected gas is perpendicular to a plane of said planar nozzle head body, said planar nozzle head body comprising a planar front nozzle body and a planar rear nozzle body, wherein an intermediate gas inlet region is formed between said planar front nozzle body and said planar rear nozzle body for introducing one of a first gas and a second gas.

4. The gas ejection head of claim 3, wherein said planar rear nozzle body includes an outer circumferential edge, said intermediate gas inlet region being formed in at least a portion of said outer circumferential edge.

5. The gas ejection head of claim 4, wherein said rear nozzle body includes diffusers.

6. The gas ejection head of claim 4, wherein said nozzle head body includes an outer circumferential surface and a gas passage, said gas passage being formed in at least a portion of said outer circumferential surface, said intermediate gas inlet region communicating with one of said outer circumferential surface and said gas passage.

7. The gas ejection head of claim 1, wherein a sum of minimum cross-sectional areas of said nozzle orifices per unit area in any section of said planar nozzle head body is substantially constant.

8. The gas ejection head of claim 1, wherein said nozzle orifices are arranged in a plurality of arrays, each of said nozzle orifices in each said arrays having a minimum cross-sectional area $F_c$ (m²) satisfying the expression.

9. The gas ejection head of claim 1, wherein said planar nozzle head body comprises a planar front nozzle head body and a planar rear nozzle head body, a plurality of intermediate gas inlet regions being formed between said planar front nozzle head body and said planar rear nozzle body, each of said nozzle orifices of said front nozzle head body and each of said intermediate gas inlet regions having a minimum cross-sectional area $F_c$ (m²) satisfying the expression so as to choke gas flow through said planar front nozzle head body and said intermediate gas inlet regions.

* * * * *

UNITED STATES PATENT AND TRADEMARK OFFICE
CERTIFICATE OF CORRECTION

PATENT NO.    : 6,132,512
DATED         : October 17, 2000
INVENTOR(S)   : Kuniaki Horie et al.

It is certified that error appears in the above-identified patent and that said Letters Patent is hereby corrected as shown below:

<u>Title page,</u>
Item [30], Foreign Application Priority Data, please insert the following:
-- February 17, 1997    [JP]    Japan ..... 9-049677 --.

Signed and Sealed this

Thirty-first Day of August, 2004

JON W. DUDAS
*Director of the United States Patent and Trademark Office*